(12) United States Patent
Joshi et al.

(10) Patent No.: US 11,101,193 B2
(45) Date of Patent: Aug. 24, 2021

(54) POWER ELECTRONICS MODULES INCLUDING INTEGRATED JET COOLING

(71) Applicant: Toyota Motor Engineering & Manufacturing North America, Inc., Plano, TX (US)

(72) Inventors: Shailesh N. Joshi, Ann Arbor, MI (US); Naoya Take, Canton, MI (US); Ercan Mehmet Dede, Ann Arbor, MI (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 0 days.

(21) Appl. No.: 16/189,549

(22) Filed: Nov. 13, 2018

(65) Prior Publication Data

US 2020/0152549 A1 May 14, 2020

(51) Int. Cl.
| | |
|---|---|
| H01L 23/13 | (2006.01) |
| H05K 7/20 | (2006.01) |
| H01L 21/48 | (2006.01) |
| H01L 23/473 | (2006.01) |
| H01L 23/492 | (2006.01) |
| H01L 23/02 | (2006.01) |
| H01L 23/427 | (2006.01) |

(52) U.S. Cl.
CPC ...... *H01L 23/4735* (2013.01); *H01L 21/4871* (2013.01); *H01L 21/4875* (2013.01); *H01L 23/02* (2013.01); *H01L 23/13* (2013.01); *H01L 23/492* (2013.01); *H05K 7/20927* (2013.01); *H05K 7/20936* (2013.01); *H01L 23/427* (2013.01); *H05K 7/20872* (2013.01); *H05K 7/20881* (2013.01)

(58) Field of Classification Search
CPC ........................................................ H05K 7/20
See application file for complete search history.

(56) References Cited

U.S. PATENT DOCUMENTS

| | | | |
|---|---|---|---|
| 5,514,906 A | 5/1996 | Love et al. | |
| 7,834,448 B2 | 11/2010 | Gerbsch | |
| 2003/0151130 A1* | 8/2003 | Cheon | F28F 3/12 257/712 |
| 2014/0264759 A1* | 9/2014 | Koontz | H01L 25/50 257/618 |

FOREIGN PATENT DOCUMENTS

| | | |
|---|---|---|
| CN | 108022894 A | 11/2018 |
| JP | 4899903 B2 | 3/2012 |
| JP | 5619232 B2 | 11/2014 |
| WO | 2017092626 A1 | 6/2017 |

* cited by examiner

*Primary Examiner* — Jerry Wu
(74) *Attorney, Agent, or Firm* — Dinsmor & Shohl, LLP (57) ABSTRACT

A power electronics module includes an electrically-conductive substrate including a base portion defining a plurality of orifices that extend through the base portion, the plurality of orifices defining a plurality of jet paths extending along and outward from the plurality of orifices, and a plurality of posts extending outward from the base portion, where individual posts of the plurality of posts are positioned between individual orifices of the plurality of orifices, and a power electronics device coupled to the plurality of posts opposite the base portion, the power electronics device defining a bottom surface that is oriented transverse to the plurality of jet paths.

14 Claims, 7 Drawing Sheets

POWER ELECTRONICS MODULES INCLUDING INTEGRATED JET COOLING

FIELD

The present specification generally relates to apparatuses for cooling power electronic devices and, more specifically, to power electronics modules including an electrically-conductive substrate with integrated jet cooling.

TECHNICAL BACKGROUND

Heat sink devices may be coupled to a heat-generating device, such as a power electronics device, to remove heat and lower the operating temperature of the heat-generating device. Cooling fluid may be used to receive heat generated by the heat-generating device by convective and/or conductive thermal transfer, and may remove such heat from the heat-generating device. For example, a jet of cooling fluid may be directed such that it impinges a surface of the heat-generating device.

However, as power electronics are designed to operate at increased power levels and generate increased corresponding heat flux due to the demands of newly developed electrical systems, conventional heat sinks are unable to adequately remove the heat flux to effectively lower the operating temperature of the power electronics to acceptable temperature levels.

Accordingly, a need exists for alternative jet impingement heat exchangers and methods to cool heat-generating devices.

SUMMARY

In one embodiment, a power electronics module includes an electrically-conductive substrate including a base portion defining a plurality of orifices that extend through the base portion, the plurality of orifices defining a plurality of jet paths extending along and outward from the plurality of orifices, and a plurality of posts extending outward from the base portion, where individual posts of the plurality of posts are positioned between individual orifices of the plurality of orifices, and a power electronics device coupled to the plurality of posts opposite the base portion, the power electronics device defining a bottom surface that is oriented transverse to the plurality of jet paths.

In another embodiment, a method for forming a power electronics module includes forming a plurality of orifices extending through an electrically-conductive substrate, the plurality of orifices defining a plurality of jet paths extending along and outward from the plurality of orifices, forming a plurality of posts extending outward from the electrically-conductive substrate, where individual posts of the plurality of posts are positioned between individual orifices of the plurality of orifices, and coupling a power electronics device to the plurality of posts, the power electronics device forming a target surface extending in a direction that is transverse to the plurality of jet paths.

In yet another embodiment, a method for cooling a power electronics device includes passing a cooling fluid along a jet path extending along an orifice extending through an electrically-conductive substrate, impinging the cooling fluid on the power electronics device positioned opposite the orifice, where the power electronics device is coupled to the electrically-conductive substrate through a plurality of posts positioned around the orifice and extends in a direction transverse to the jet path, and sending electrical current between the power electronics device and the electrically-conductive substrate through the plurality of posts positioned between the electrically-conductive substrate and the power electronics device.

Additional features of the power electronics modules and methods for cooling power electronics modules described herein will be set forth in the detailed description which follows, and in part will be readily apparent to those skilled in the art from that description or recognized by practicing the embodiments described herein, including the detailed description which follows, the claims, as well as the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments, and are incorporated into and constitute a part of this specification. The drawings illustrate the various embodiments described herein, and together with the description serve to explain the principles and operations of the claimed subject matter.

DETAILED DESCRIPTION

Reference will now be made in detail to embodiments of power electronics modules and methods of operating the same, examples of which are illustrated in the accompanying drawings. Whenever possible, the same reference numerals will be used throughout the drawings to refer to the same or like parts.

Embodiments described herein are directed to heat-generating devices and methods for cooling the heat-generating devices. The heat-generating devices may include, as one example, power electronics modules including a power electronics device. The power electronics device generally generates heat during operation that should be dissipated. Cooling fluid may be utilized to dissipate the heat, and it is generally desirable to position the cooling fluid as close as possible to the power electronics device to increase the efficiency of the cooling fluid in dissipating heat from the power electronics device. Embodiments described herein are directed to power electronics modules that are configured to allow cooling fluid to be impinged on the power electronics device such that the cooling fluid is positioned as close to the power electronics device as possible without intervening insulating components.

In particular, embodiments herein are directed to power electronics modules including a power electronics device and an electrically-conductive substrate. The electrically-conductive substrate generally includes a base portion defining a plurality of orifices extending through the base portion and a plurality of jet paths extending along and outward from the plurality of orifices. The electrically-conductive substrate further includes a plurality of posts extending outward from the base portion, where the plurality of posts are positioned between individual orifices of the plurality of orifices. The power electronics device is coupled to the plurality of posts and defines a bottom surface that is oriented transverse to the plurality of jet paths. Cooling fluid may be passed through the plurality of jet paths and impinge on the bottom surface of the power electronics device to remove thermal energy generated by the power electronics device. The electrically-conductive substrate may also be electrically coupled to the power electronics device and may serve as a collector electrode electrically coupled to the power electronics device.

Because the electrically-conductive substrate can simultaneously provide jet cooling to the power electronics device and serve as a collector electrode electrically coupled to the power electronics device, jet cooling may be positioned closer to the power electronics device as compared to conventional power electronics modules, which may include one or more intervening and insulating components positioned between the power electronics device and the cooling fluid. By contrast, in some embodiments of the present application, cooling fluid may be directly impinged on the power electronics device without impinging any intervening layers or components positioned on the power electronics device. Various embodiments of power electronics modules and methods for operating the same will be described herein with specific reference to the appended drawings.

As used herein, the term "longitudinal direction" refers to the forward-rearward direction of the power electronics module (i.e., in the +/−X-direction as depicted). The term "lateral direction" refers to the cross-direction of the power electronics module (i.e., in the +/−Y-direction as depicted), and is transverse to the longitudinal direction. The term "vertical direction" refers to the upward-downward direction of the power electronics module (i.e., in the +/−Z-direction as depicted), and is transverse to the lateral and the longitudinal directions.

Figure 1:
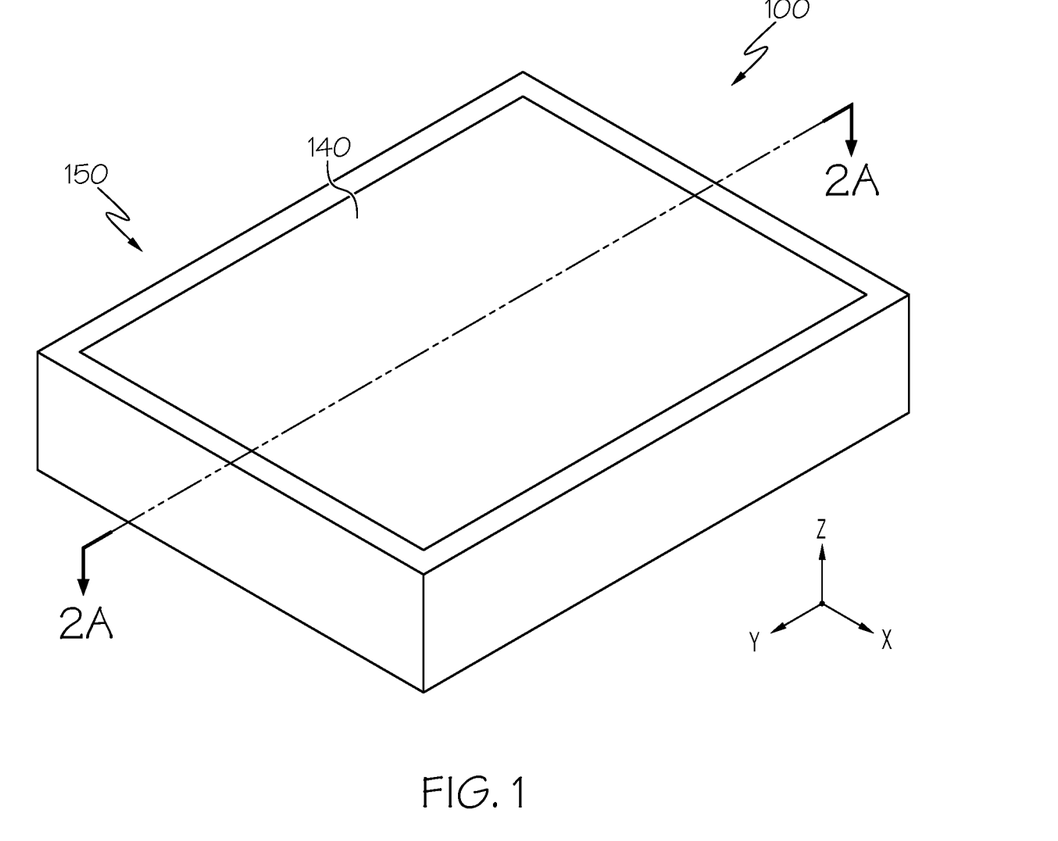
FIG. 1 schematically depicts a perspective view of a power electronics module positioned within a housing, according to one or more embodiments shown and described herein.

Referring initially to FIG. 1, a perspective view of an example power electronics module 100 is schematically depicted. The power electronics module 100 generally includes a power electronics device 140 positioned at least partially within a housing 150. The housing 150 may be formed from a thermally conductive material that receives and dissipates heat from the power electronics device 140. For example and without limitation, the housing 150 may be formed from aluminum, silver, gold, copper, or the like. While the power electronics device 140 and the housing 150 depicted in FIG. 1 generally define rectangular shapes, it should be understood that the power electronics device 140 and the housing 150 may include any suitable shape.

The power electronics module 100 may be one or more semiconductor devices that may include, without limitation, an insulated-gate bipolar transistor (IGBT), a reverse conducting IGBT (RC-IGBT), a metal-oxide-semiconductor field-effect transistor (MOSFET), a power MOSFET, diodes, transistors, and/or combinations thereof (e.g., power cards). In some embodiments, the power electronics device 140 may include a wide-bandgap semiconductor, and may be formed from any suitable material, for example and without limitation diamond, silicon carbide (SiC), or the like.

The power electronics module 100 may be used in a vehicular electrical system, for example as part of an inverter system in an electric or hybrid-electric vehicle. In vehicular applications, the power electronics devices 140 may generate significant heat flux which should be dissipated to maintain the power electronics devices 140 at a suitable operating temperature. While the power electronics modules 100 described herein are generally described as being utilized in a vehicular electrical system, it should be understood that the power electronics modules 100 may also be utilized in any other suitable application.

Figure 2A:
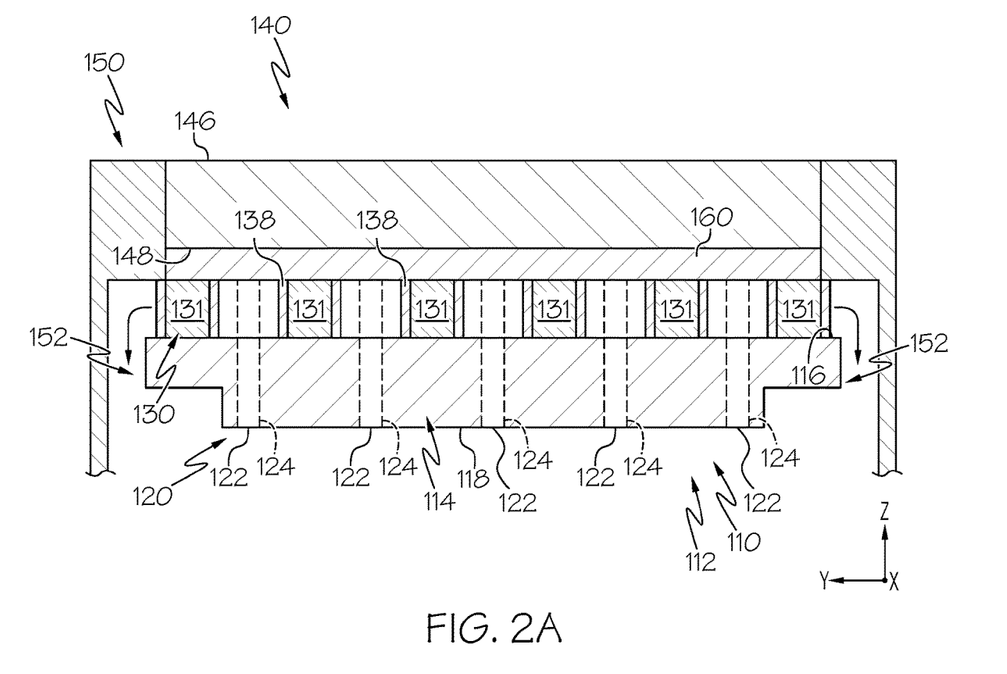
FIG. 2A schematically depicts a section view of the power electronics module of FIG. 1 along section 2A-2A of FIG. 1, according to one or more embodiments shown and described herein.

Referring to FIG. 2A, a section view of the power electronics module 100 along section 2A-2A of FIG. 1 is schematically depicted. The power electronics device 140 generally defines an upper surface 146 oriented to face upwards in the vertical direction and a bottom surface 148 that is positioned opposite the upper surface 146 and that is oriented to face downwards in the vertical direction. The power electronics device 140 is electrically coupled to a collector electrode 110, which in the embodiment depicted in FIG. 2A is an electrically-conductive substrate 112.

The electrically-conductive substrate 112 generally includes a base portion 114 and a plurality of posts 130 extending outward from the base portion 114. The electrically-conductive substrate 112 is formed of an electrically conductive material, such as copper, a copper alloy, or the like. The base portion 114 defines an inlet face 118 that is oriented to face downward in the vertical direction, and an outlet face 116 positioned opposite the inlet face 118 and oriented to face upward in the vertical direction. The base portion 114 further defines a plurality of orifices 120 extending through the base portion 114 between the inlet face 118 and the outlet face 116. The plurality of orifices 120 includes individual orifices 122 that collectively define a plurality of jet paths 124 extending along and outward from the plurality of orifices 120. The plurality of jet paths 124 extends in the vertical direction such that the plurality of jet paths 124 is transverse to the bottom surface 148 of the power electronics device 140. The bottom surface 148 of the power electronics device 140 may form a target surface, and cooling fluid may be passed through the plurality of orifices 120 along the plurality of jet paths 124 to impinge on bottom surface 148 and/or an intermediate layer 160, as described in greater detail herein.

The plurality of posts 130 extends outward from the outlet face 116 of the base portion 114 of the electrically-conductive substrate 112. An impingement distance (i.e., a distance evaluated between the plurality of orifices 120 and the bottom surface 148 of the power electronics device 140) influences the amount of thermal energy that may be absorbed from the power electronics device 140 when cooling fluid passing through the plurality of orifices 120 is impinged against the power electronics device 140. As shown in FIG. 2A, the impingement distance is dependent upon the height of the plurality of posts 130 evaluated in the vertical direction. As such, the height of the plurality of posts 130 may be selected to achieve a desired impingement distance. In some embodiments, the height of the plurality of posts 130 evaluated in the vertical direction is between 100 micrometers and 300 micrometers, inclusive of the endpoints. In one embodiment, the height of the plurality of posts 130 evaluated in the vertical direction is about 200 micrometers.

The plurality of posts 130 is electrically coupled to the power electronics device 140 such that electrical current may be transmitted between the base portion 114 and the power electronics device 140 through the plurality of posts 130. Without being bound by theory, the size and shape of the posts 131 of the plurality of posts 130 influences the transmission of electrical current between the base portion 114 and the power electronics device 140 through the plurality of posts 130, as well as the transmission of thermal energy through the plurality of posts 130. In one embodiment, each of the posts 131 define a cross-sectional area evaluated in a plane extending in the lateral and the longitudinal directions that is between 0.25 millimeters squared and 0.75 millimeters squared. In another embodiment, each of the posts 131 define a cross-sectional area evaluated in a plane extending in the lateral and the longitudinal directions that is that is about 0.5 millimeters squared. The specific geometry and cross-sectional area of each of the posts 131 of the plurality of posts 130 may be selected to achieve desired cooling and/or electrical transmission properties.

In embodiments, the plurality of posts 130 may be integral with the base portion 114 and may be formed on the base portion 114 through a subtractive machining process or an additive manufacturing process, as described in greater detail herein. In other embodiments, the plurality of posts 130 may be coupled to the base portion 114 and may be formed from the same or a different material than the base portion 114.

Figure 2B:
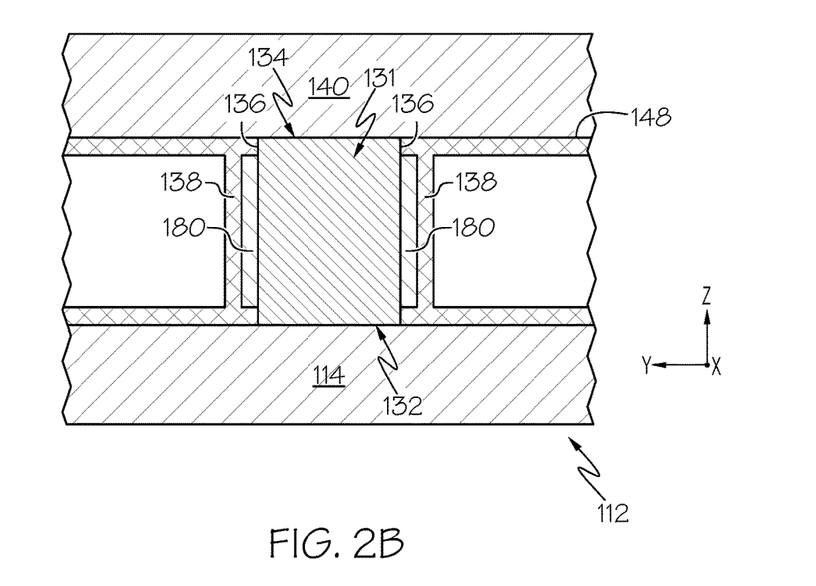
FIG. 2B schematically depicts an enlarged view of a post of the power electronics module of FIG. 2A, according to one or more embodiments shown and described herein.

Referring to FIG. 2B, an enlarged view of a post 131 of the plurality of posts 130 is schematically depicted. Each of the posts 131 of the plurality of posts 130 generally include a base end 132 engaged with the base portion 114 and a power electronics device end 134 positioned opposite the base end 132 and engaged with the power electronics device 140. Each of the plurality of posts 130 further include at least one outward-facing surface 136 positioned between the base end 132 and the power electronics device end 134. The at least one outward-facing surface 136 of each of the plurality of posts 130 is generally oriented to face outward in the lateral and/or the longitudinal direction from each of the posts 131.

In embodiments, the power electronics module 100 further includes an electrically-insulating layer 138 positioned on the at least one outward-facing surface 136 of each of the plurality of posts 130. In some embodiments, the electrically-insulating layer 138 may additionally be positioned on the power electronics device 140 and/or the base portion 114 of the electrically-conductive substrate 112 (FIG. 2A). The electrically-insulating layer 138 is formed from an electrically-insulating material that inhibits the transmission of electrical current through the electrically-insulating layer 138, such as and without limitation, aluminum oxide, phosphate, parylene, or the like. In embodiments, the electrically-insulating layer 138 may have a thickness of less than 1 micrometer and may be deposited on the at least one outward-facing surface 136 of each of the plurality of posts 130 through a suitable deposition process, such as atomic layer deposition, chemical vapor deposition, or the like.

The electrically-insulating layer 138 may generally insulate each of the posts 131 such that electrical current may not be passed from the at least one outward-facing surface 136 through the electrically-insulating layer 138, for example to a cooling fluid in contact with and positioned outside the posts 131. However, as noted above, the electrically-insulating layer 138 may have a small thickness (e.g., less than about 1 micrometer). The relatively small thickness of the electrically-insulating layer 138 may allow thermal energy to be passed from the at least one outward-facing surface 136 through the electrically-insulating layer 138. In some embodiments, the electrically-insulating layer 138 may also be positioned on the bottom surface 148 of the power electronics device 140 and/or the base portion 114 of the electrically-conductive substrate 112 to electrically insulate the power electronics device 140 and/or the electrically-conductive substrate 112.

Figure 2C:
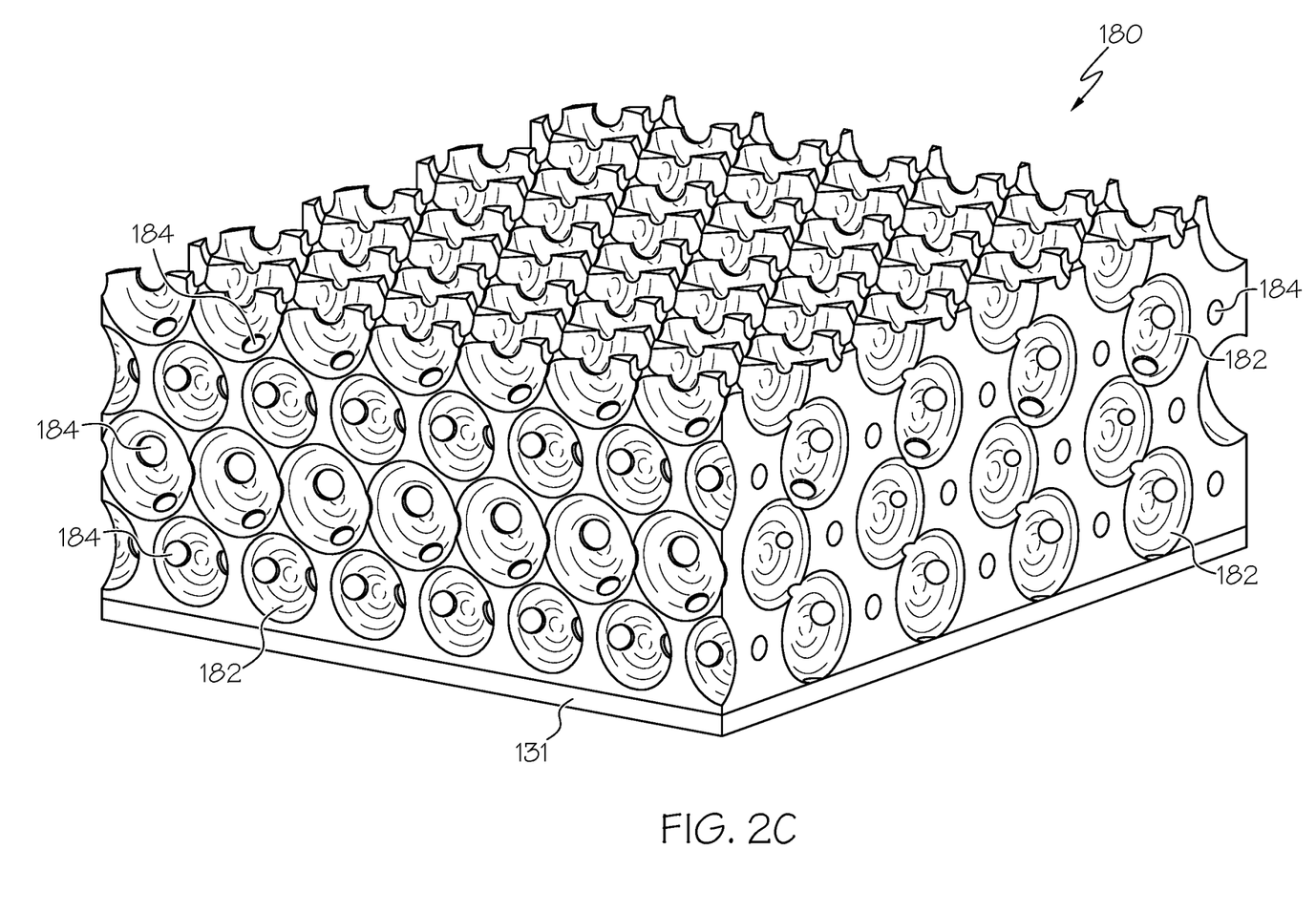
FIG. 2C schematically depicts an enlarged view of a porous coating on the post of the power electronics module of FIG. 2B, according to one or more embodiments shown and described herein.

Referring collectively to FIGS. 2B and 2C, in some embodiments, the power electronics module 100 may include a porous coating 180 positioned on the posts 131 that may assist in transferring thermal energy from the posts 131. In some embodiments, the porous coating 180 may be any inverse opal structure, such as, for example, a metal inverse opal (MIO) structure (e.g., a copper inverse opal (CIO) structure, a nickel inverse opal (NIO) structure, or the like) or the like. As depicted, the porous coating 180 may have a plurality of dimples 182 (or other similar depression or indentation) and a plurality of networked pores 184 extending throughout the porous coating 180 such that cooling fluid can flow through each of the plurality of networked pores 184 and contact a greater amount of surface area for the purposes of heat transfer. While the dimples 182 and the pores 184 are specifically shown and described herein, the porous coating 180 may include other surface features that increase heat transfer without departing from the scope of the present disclosure. In embodiments, the porous coating 180 may assist in transferring thermal energy from the electrically-conductive substrate 112 to a cooling fluid in contact with the posts 131 through the porous coating 180. In some embodiments, the electrically-insulating layer 138 is positioned on the porous coating 180 (e.g., over the dimples 182 and the pores 184) to electrically insulate the porous coating 180. In other embodiments, the porous coating 180 may be positioned over the electrically-insulating layer 138, such that the electrically-insulating layer 138 is positioned between the porous coating 180 and the posts 131. While the embodiment depicted in FIGS. 2B and 2C depict a porous coating 180 including an inverse opal structure, it should be understood that the porous coating 180 may include any suitable surface texture to assist in transferring thermal energy from the posts 131 to a cooling fluid. For example, in some embodiments, the porous coating 180 may be formed of a sintered coating or the like.

Referring again to FIG. 2A, in some embodiments, the power electronics module 100 optionally includes an intermediate layer 160 positioned between the plurality of posts 130 and the power electronics device 140 in the vertical direction, and the plurality of posts 130 are coupled to the power electronics device 140 through the intermediate layer 160. In the embodiment depicted in FIG. 2A, the intermediate layer 160 may generally include a solder plate that extends between individual posts 131 of the plurality of posts 130 in the lateral and/or the longitudinal directions. In other embodiments, the intermediate layer 160 may include solder solely positioned at discrete positions between the plurality of posts 130 and the power electronics device 140 to couple the plurality of posts 130 to the power electronics device 140. In these embodiments, the solder does not generally extend between individual posts 131 of the plurality of posts 130 in the lateral and/or the longitudinal directions.

In some embodiments, the intermediate layer 160 may include an encapsulated phase change material. For example, the intermediate layer may include a phase change material, such as and without limitation, hydrated salt, polymer materials, molten salt, metal alloys, paraffin, carboxylic acid, ester, polyol, organic matter, crystal hydrated salt, high density polyethylene, or any suitable combination thereof. The phase change material may be encapsulated within the intermediate layer by any suitable encapsulating material. The phase change material may be selected such that the phase change material within the intermediate layer 160 is configured to transition between one phase (e.g. a solid state) to another phase (e.g. a liquid state) at or around the operating temperature of the power electronics device 140. Without being bound by theory, the re-arrangement of the structure of a material as the material changes to a higher phase (e.g. from a solid state to a liquid state) requires thermal energy, such that the material absorbs thermal energy from its surroundings when changing to the higher phase. As such, by including an intermediate layer 160 including an encapsulated phase change material, the intermediate layer 160 may absorb more thermal energy from the power electronics device 140 as compared to configurations that do not include an intermediate layer 160 with the encapsulated phase change material.

Figure 3:
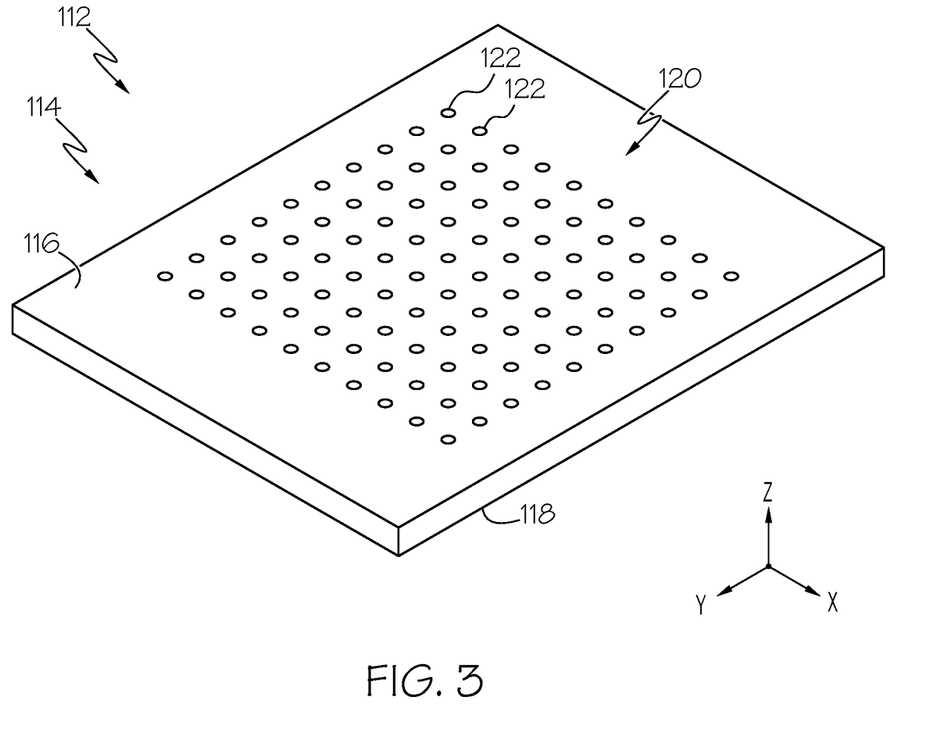
FIG. 3 schematically depicts a perspective view of an electrically-conductive substrate of the power electronics module of FIG. 2A defining a plurality of orifices, according to one or more embodiments shown and described herein.

Referring to FIG. 3, a perspective view of the base portion 114 of the electrically-conductive substrate 112 is shown in isolation. As described above, the base portion 114 generally defines the inlet face 118 and the outlet face 116 positioned opposite the inlet face 118. The base portion 114 further defines the plurality of orifices 120 extending through the base portion 114 between the inlet face 118 and the outlet face 116. In embodiments, the individual orifices 122 of the plurality of orifices 120 are spaced apart from one another in the lateral and the longitudinal directions. While the embodiment depicted in FIG. 3 shows the orifices 122 periodically spaced apart from one another and arranged such that the plurality of orifices 120 forms a rectangular shape on the base portion 114, it should be understood that in other embodiments, the orifices 122 may be irregularly spaced apart from one another and arranged such that the plurality of orifices 120 form any other suitable shape on the base portion 114.

Figure 4A:
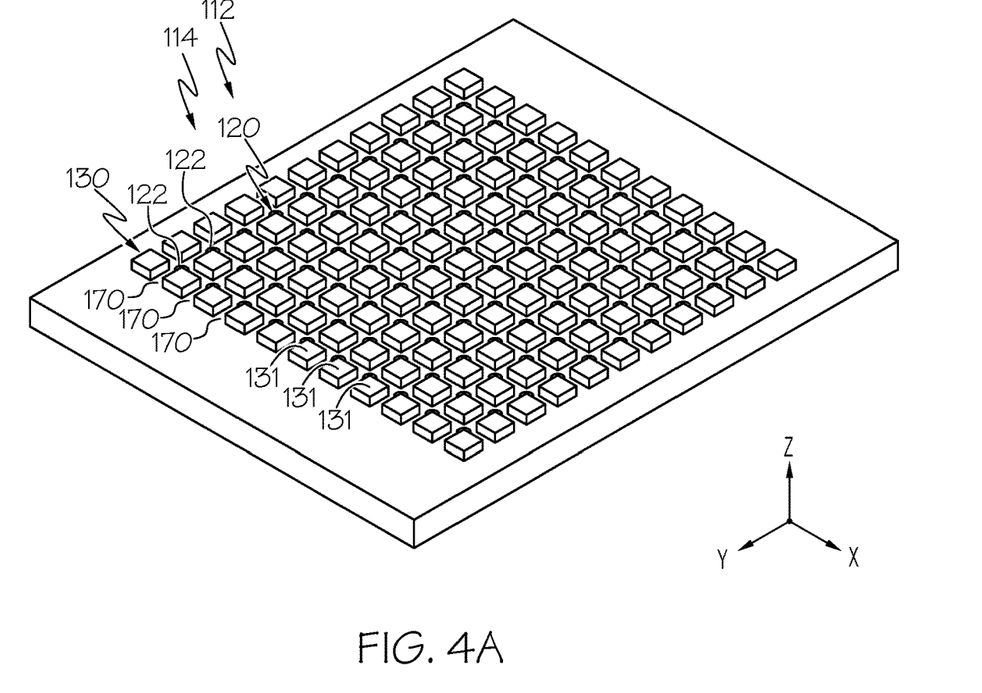
FIG. 4A schematically depicts a perspective view of the electrically-conductive substrate of FIG. 3 with a plurality of posts positioned between individual orifices of the plurality of orifices, according to one or more embodiments shown and described herein.

Referring to FIG. 4A, a perspective view of the base portion 114 of the electrically-conductive substrate 112 is shown with the plurality of posts 130. The plurality of posts 130 is positioned on the outlet face 116 of the base portion 114 and extends outward from the base portion 114 in the vertical direction. In some embodiments, the plurality of posts 130 is integrally formed with the base portion 114, and may be formed through any suitable process. For example, in some embodiments, the plurality of posts 130 may be formed in an additive process, such as by three-dimensional printing, electrodepositing, or the like. In other embodiments, the plurality of posts may be formed through a subtractive machining process, such as by a Lithographie, Galvanoformung, Abformung (LIGA) machining process, or other suitable process. In other embodiments, the plurality of posts 130 may be coupled to the base portion 114. For example and without limitation, the plurality of posts 130 may be formed from solder or the like coupled to the base portion 114.

In embodiments, the individual posts 131 of the plurality of posts 130 are periodically spaced from one another and are positioned between individual orifices 122 of the plurality of orifices 120 in the lateral and the longitudinal directions. The plurality of posts 130 define cooling fluid passageways 170 positioned between adjacent posts 131 of the plurality of posts 130. The length and width of the cooling fluid passageways 170 in the lateral and the longitudinal directions influence the transmission of thermal energy from the posts 131 and/or the base portion 114 and the power electronics device 140 (FIG. 2A) to cooling fluid positioned within the cooling fluid passageways 170. The length and width of the cooling fluid passageways 170 is defined by the size, shape, and positioning of the posts 131 of the plurality of posts 130. Accordingly, the size, shape, and positioning of the posts 131 may be selected to optimize the transfer of thermal energy from the from the posts 131 and/or the base portion 114 and the power electronics device 140 (FIG. 2A) to cooling fluid positioned within the cooling fluid passageways 170.

Figure 4B:
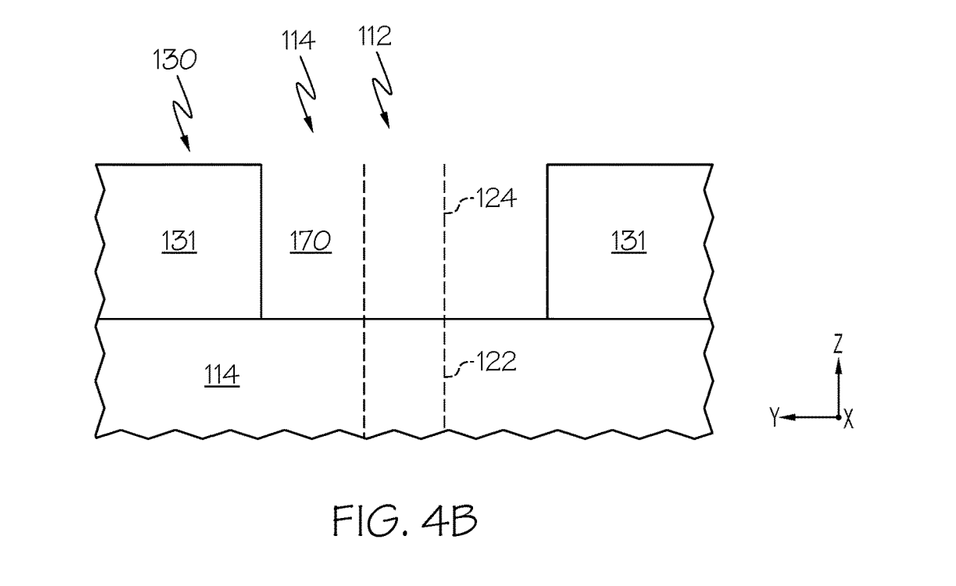
FIG. 4B schematically depicts an enlarged side-view of the electrically-conductive substrate of FIG. 4A, according to one or more embodiments shown and described herein.

In particular and referring to FIG. 4B, an enlarged view of a pair of adjacent posts 131 on the base portion 114 is schematically depicted. The cooling fluid passageways 170 are positioned between the adjacent posts 131, and allow coolant fluid to flow outward from the electrically-conductive substrate 112 in the lateral and the longitudinal directions subsequent to passing through the plurality of orifices 120 and impinging on the power electronics device 140 (FIG. 1). In embodiments, the cooling fluid passageways 170 are electrically isolated from the plurality of posts 130. For example, the electrically-insulating layer 138 (FIG. 2B) positioned on the at least one outward-facing surface 136 (FIG. 2B) of the posts 131 electrically insulates the posts 131 from the cooling fluid passageways 170, while permitting thermal energy to be transmitted between the posts 131 and the cooling fluid passageways 170.

Figure 5A:
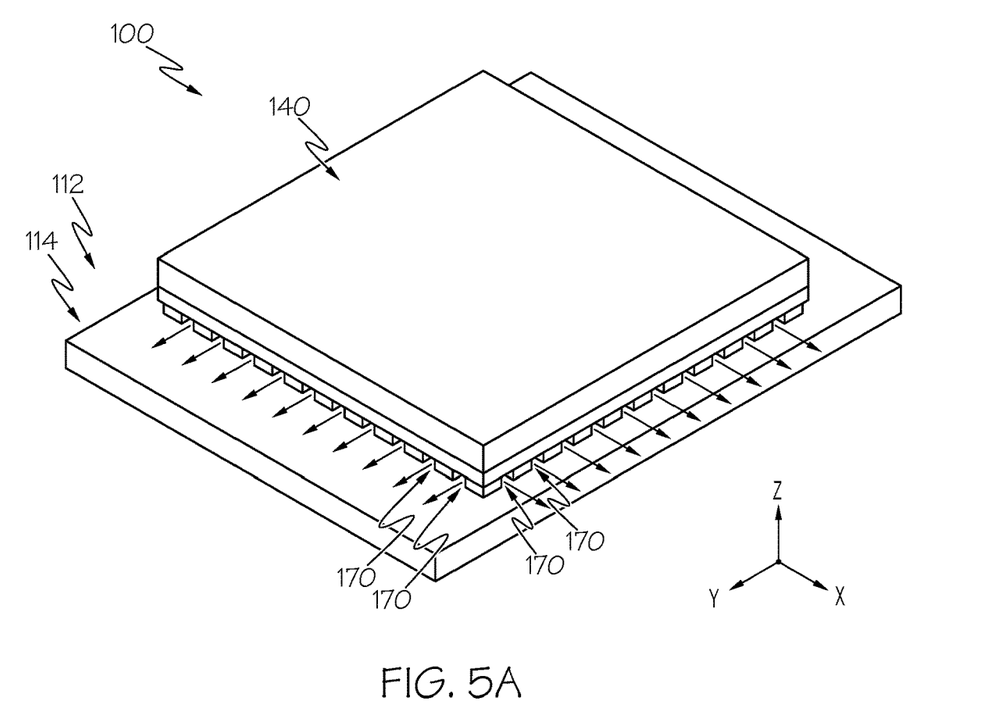
FIG. 5A schematically depicts a perspective view of the power electronics module of FIG. 1 with the housing removed, according to one or more embodiments shown and described herein.
Figure 5B:
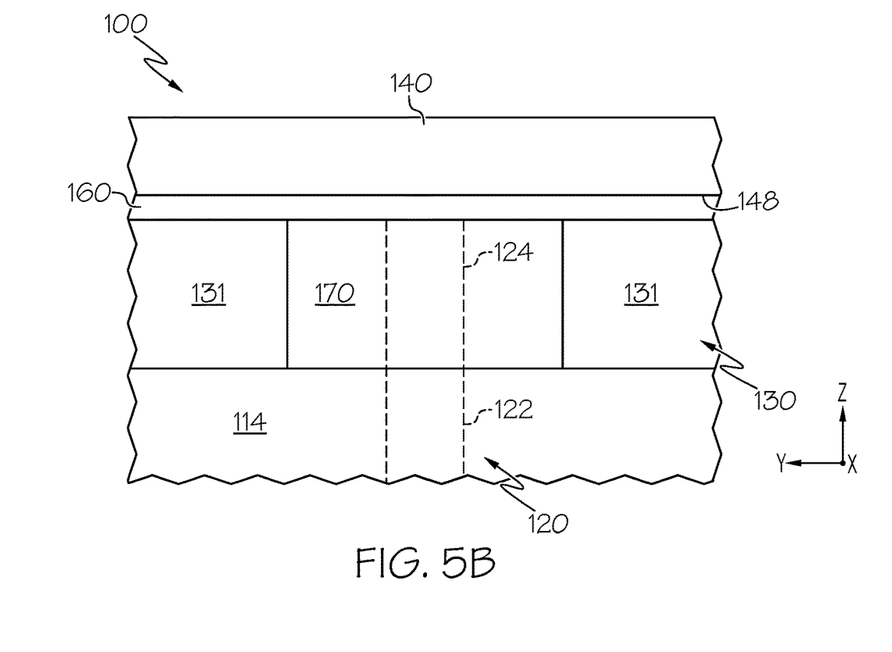
FIG. 5B schematically depicts an enlarged side view of the power electronics module of FIG. 5A, according to one or more embodiments shown and described herein.

Referring to FIGS. 5A and 5B, a perspective view and an enlarged side view of the power electronics module 100 is depicted with the housing 150 (FIG. 1) removed. In operation, the power electronics device 140 generates heat that must be dissipated to maintain the power electronics device 140 within an acceptable temperature range. To dissipate heat generated by the power electronics device 140, a cooling fluid is passed through orifices 122 of the plurality of orifices 120 and impinges on the power electronics device 140. In the embodiment shown in FIG. 5B, the cooling fluid impinges on the intermediate layer 160 positioned between the posts 131 of the plurality of posts 130. In other embodiments, such as embodiments that do not include the intermediate layer 160 and/or in which the intermediate layer 160 does not extend between the posts 131 of the plurality of posts 130, the cooling fluid may directly impinge on the bottom surface 148 of the power electronics device 140.

Subsequent to impinging on the power electronics device 140, the cooling fluid flows outward towards an outer perimeter of the electrically-conductive substrate 112. More particularly, the cooling fluid generally passes through the cooling fluid passageways 170 positioned between the posts 131 of the plurality of posts 130 toward the outer perimeter of the electrically-conductive substrate 112.

Referring again to FIG. 2A, the housing 150 may generally encapsulate the electrically-conductive substrate 112, such the cooling fluid passageways 170 (FIG. 5B) are contained within the housing 150. In embodiments, the housing 150 and the electrically-conductive substrate 112 and the housing define an outlet channel 152 positioned between the housing 150 and the outer perimeter of the electrically-conductive substrate 112 and in fluid communication with the cooling fluid passageways 170 (FIG. 5B). As the cooling fluid flows outward in the lateral and the longitudinal directions along the cooling fluid passageways 170 (FIG. 5B) to the outer perimeter of the electrically-conductive substrate 112, the cooling fluid may flow downward through the outlet channel 152. The cooling fluid may subsequently be cooled, and then passed through the plurality of orifices 120 to impinge on the power electronics device 140 again, thereby repeating the process.

In some embodiments, the cooling fluid may be formed from an electrically-conductive fluid, such as an ethylene glycol mixture, water, or the like. As described above, in some embodiments, the posts 131 (FIG. 2B) may include the electrically-insulating layer 138, which electrically insulates the posts 131 from the cooling fluid in the cooling fluid passageways 170 (FIG. 5B). Because the electrically-insulating layer 138 insulates the post 131 from the cooling fluid, cooling fluid may be utilized within the electrically-conductive substrate 112, as compared to conventional configurations. For example, in conventional configurations, cooling fluid may be spaced apart from the electrically-conductive substrate 112 by one or more intervening and insulating components, and accordingly may be spaced apart from the power electronics device 140, thereby reducing the effectiveness of the cooling fluid in removing thermal energy from the power electronics device 140.

By contrast, because the posts 131 (FIG. 2B) of the present disclosure include the electrically-insulating layer 138, cooling fluid may be directly impinged on the power electronics device 140 and may incorporated with the electrically-conductive substrate 112 to cool the power electronics device 140. As the cooling fluid may be incorporated with the electrically-conductive substrate 112, heat flux from the power electronics device 140 may be more effectively transferred to the cooling fluid. In other embodiments, such as those not including the electrically-insulating layer 112, dielectric cooling fluid may be utilized.

Figure 6:
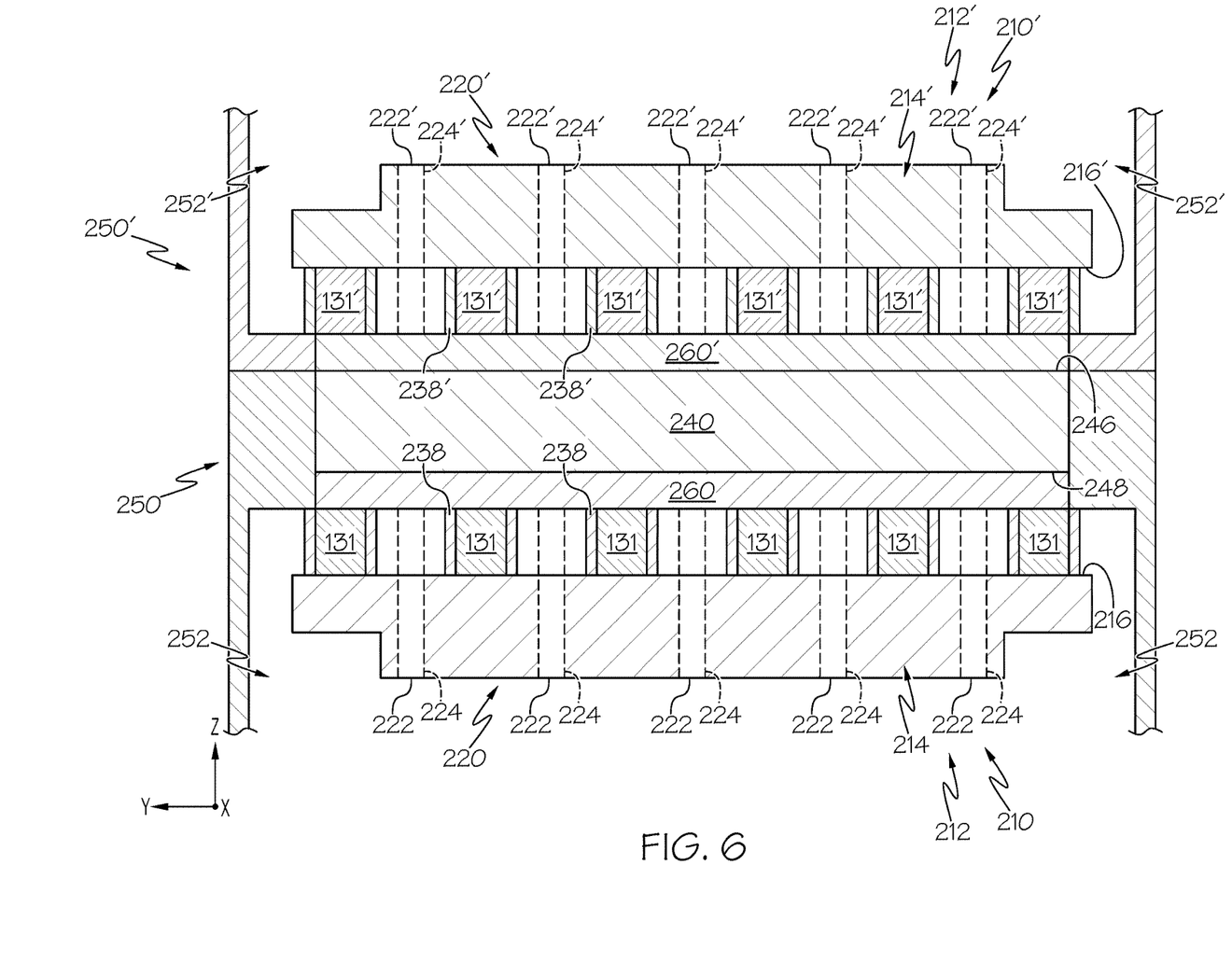
FIG. 6 schematically depicts a section view of a dual-sided power electronics module according to one or more embodiments shown and described herein.

Referring now to FIG. 6, a section view of another power electronics module 200 is schematically depicted. Like the embodiment described above and depicted in FIG. 2A, the power electronics module 200 includes a power electronics device 240 defining an upper surface 246 and a bottom surface 248 positioned opposite the upper surface 246. The power electronics module 200 further includes the collector electrode 210 including the electrically-conductive substrate 212 coupled to the bottom surface 248 of the power electronics device 240.

However, in the embodiment depicted in FIG. 6, the collector electrode 210 is a first collector electrode 210, and the power electronics module 200 further includes a second collector electrode 210' including an electrically-conductive substrate 212' coupled to and/or electrically coupled to the upper surface 246 of the power electronics device 240. The first and the second collector electrode 210, 210' are substantially the same, and each include the base portion 214, 214', respectively, the base portion 214, 214' defining a plurality of orifices 220, 220' extending through the base portion 214, 214', respectively. The orifices 222, 222' of the plurality of orifices 220, 220' each define the plurality of jet paths 224, 224', respectively extending along and outward from the orifices 222, 222'.

The power electronics module 200 optionally further includes the intermediate layer 260 positioned between the posts 231 and the bottom surface 248 of the power electronics device 240. The posts 231 may further include the electrically-insulating layer 238 positioned on at least one outward-facing surface of the posts 231. In the embodiment depicted in FIG. 6, the power electronics module 200 optionally further includes an intermediate layer 260' positioned between posts 231' of the second electrically-conductive substrate 212' and the upper surface 246 of the power electronics device 240. The posts 231' of the second electrically-conductive substrate 212' may include the electrically-insulation layer 238' positioned on at least one outward-facing surface of the posts 231'.

Cooling fluid, as described above, may be passed through the orifices 222 of the first electrically-conductive substrate 212 and impinge on the intermediate layer 160 and/or the bottom surface 248 of the power electronics device 240. However, in the embodiment depicted in FIG. 6, cooling fluid may also be passed through the orifices 222' of the second electrically-conductive substrate 212' and impinge on the intermediate layer 160' and/or the upper surface 246 of the power electronics device 240. In this way, cooling fluid may be impinged on both the upper surface 246 and the bottom surface 248, of the power electronics device 240, which may increase the amount of thermal energy that may be transferred from the power electronics device 240 to the cooling fluid.

In some embodiments, the power electronics module 200 may further include a second housing 250' that at least partially encapsulates the second electrically-conductive substrate 212'. The housing 250 and the second housing 250 may both define the outlet channels 252, 252', respectively, through which cooling fluid may pass after impinging on the power electronics device 240, as described above.

Accordingly, it should now be understood that embodiments described herein are directed to power electronics modules including an electrically-conductive substrate and a power electronics device coupled to the electrically-conductive substrate. The electrically-conductive substrate generally includes a base portion defining a plurality of orifices extending through the base portion and defining a plurality of jet paths extending along and outward from the plurality of orifices. The electrically-conductive substrate further includes a plurality of posts extending outward from the plurality of posts positioned between individual orifices of the plurality of orifices. The power electronics device is coupled to the plurality of posts and defines a bottom surface that is oriented transverse to the plurality of jet paths. Cooling fluid may be passed through the plurality of jet paths and impinge on the bottom surface of the power electronics device to remove thermal energy generated by the power electronics device. The electrically-conductive substrate may also be electrically coupled to the power electronics device and may serve as a collector electrode electrically coupled to the power electronics device. Because the electrically-conductive can simultaneously provide jet cooling to the power electronics device and serve as a collector electrode electrically coupled to the power electronics device, the jet cooling may be positioned closer to the power electronics device as compared to conventional power electronics modules. For example, in some embodiments, cooling fluid may be directly impinged on the power electronics device without impinging an intervening layers or components positioned on the power electronics device.

It will be apparent to those skilled in the art that various modifications and variations can be made to the embodiments described herein without departing from the spirit and scope of the claimed subject matter. Thus it is intended that the specification cover the modifications and variations of the various embodiments described herein provided such modification and variations come within the scope of the appended claims and their equivalents.

What is claimed is:

1. A power electronics module comprising: an electrically-conductive substrate comprising: a base portion defining an inlet face oriented to face downward in a vertical direction, an outlet face positioned opposite the inlet face and oriented to face upward in the vertical direction, and a plurality of orifices that extend between the inlet face and the outlet face, the plurality of orifices defining a plurality of jet paths extending along and outward from the plurality of orifices; and a plurality of posts extending outward from and positioned on the outlet face of the base portion, wherein individual posts of the plurality of posts are positioned adjacent to individual orifices of the plurality of orifices; and a power electronics device coupled to the plurality of posts opposite the base portion, the power electronics device defining a bottom surface that is oriented transverse to and intersects the plurality of jet paths, such that fluid passing along the plurality of jet paths impinges the bottom surface of the power electronics device; the plurality of posts define cooling fluid passageways extending outward from and in a direction transverse to the plurality of jet paths, the cooling fluid passageways extending between adjacent posts of the plurality of posts.

2. The power electronics module of claim 1, wherein the power electronics device is electrically coupled to the base portion through the plurality of posts.

3. The power electronics module of claim 2, wherein each of the plurality of posts comprise a base end engaged with the base portion, a power electronics device end positioned opposite the base end, and at least one outward-facing surface positioned between the base end and the power electronics device end, wherein the power electronics module further comprises an electrically-insulating layer positioned on the at least one outward-facing surface of each of the plurality of posts.

4. The power electronics module of claim 3, wherein the electrically-insulating layer comprises a thickness that is less than 1 micrometer.

5. The power electronics module of claim 1, further comprising an intermediate layer positioned between and coupled to the power electronics device and the plurality of posts.

6. The power electronics module of claim 5, wherein the intermediate layer comprises a solder plate extending across the bottom surface of the power electronics device.

7. The power electronics module of claim 5, wherein the intermediate layer comprises an encapsulated phase change material extending across the bottom surface of the power electronics device.

8. A method for forming a power electronics module, the method comprising: forming a plurality of orifices extending between an inlet face facing downward and an upward-facing opposite outlet face of an electrically-conductive substrate, the plurality of orifices defining a plurality of jet paths extending along and outward from the plurality of orifices; forming a plurality of posts extending outward from and positioned on the outlet face of the electrically-conductive substrate, wherein individual posts of the plurality of posts are positioned adjacent to individual orifices of the plurality of orifices; and coupling a power electronics device to the plurality of posts, the power electronics device forming a target surface extending in a direction that is transverse to and intersected by the plurality of jet paths, such that fluid passing along the plurality of jet paths impinges the target surface of the power electronics device; the plurality of posts forming a plurality of cooling fluid passageways extending outward from and in a direction transverse to the plurality of jet paths, the cooling fluid passageways extending between adjacent posts of the plurality of posts.

9. The method of claim 8, wherein coupling the power electronics device to the plurality of posts comprises electrically coupling the power electronics device to the electrically-conductive substrate.

10. The method of claim 8, further comprising applying an electrically-insulating layer to outward-facing surfaces of the plurality of posts positioned between a base end of the plurality of posts and a power electronics device end of the plurality of posts that is coupled to the power electronics device.

11. The method of claim 10, wherein applying the electrically-insulating layer comprises atomic layer deposition of the electrically-insulating layer.

12. A method for cooling a power electronics device, the method comprising: passing a cooling fluid along a jet path extending along an orifice extending between an inlet face facing downward and an upward-facing opposite outlet face of an electrically-conductive substrate; impinging the cooling fluid on a bottom surface of the power electronics device positioned opposite the orifice, wherein the power electronics device is coupled to the electrically-conductive substrate through a plurality of posts each of the posts adjacent to at least one orifice and, positioned on and extending from the outlet face in a direction transverse to and is intersected by the jet path; and sending electrical current between the power electronics device and the electrically-conductive substrate through the plurality of posts positioned between the electrically-conductive substrate and the power electronics device; the plurality of posts forming a plurality of cooling fluid passageways extending outward from and in a direction transverse to the plurality of jet paths, the cooling fluid passageways extending between adjacent posts of the plurality of posts.

13. The method of claim 12, wherein impinging the cooling fluid on the power electronics device comprises impinging the cooling fluid directly on the power electronics device.

14. The method of claim 12, wherein impinging the cooling fluid on the power electronics device comprises impinging the cooling fluid on a solder plate positioned between the plurality of posts and the power electronics device.

* * * * *

UNITED STATES PATENT AND TRADEMARK OFFICE
CERTIFICATE OF CORRECTION

PATENT NO. : 11,101,193 B2  
APPLICATION NO. : 16/189549  
DATED : August 24, 2021  
INVENTOR(S) : Shailesh N. Joshi, Naoya Take and Ercan Mehmet Dede

Page 1 of 1

It is certified that error appears in the above-identified patent and that said Letters Patent is hereby corrected as shown below:

On the Title Page

Item (74), attorney, agent, or firm, delete "Dinsmor & Shohl, LLP" and insert --Dinsmore & Shohl LLP--, therefor.

Signed and Sealed this  
Seventh Day of December, 2021

Drew Hirshfeld  
*Performing the Functions and Duties of the*  
*Under Secretary of Commerce for Intellectual Property and*  
*Director of the United States Patent and Trademark Office*